(12) United States Patent
Lee et al.

(10) Patent No.: US 7,514,986 B2
(45) Date of Patent: Apr. 7, 2009

(54) VOLTAGE SUPPLIER OF SEMICONDUCTOR MEMORY DEVICE

(75) Inventors: Kang-Seol Lee, Ichon-shi (KR); Jae-Jin Lee, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 12/027,089

(22) Filed: Feb. 6, 2008

(65) Prior Publication Data

US 2008/0129373 A1    Jun. 5, 2008

Related U.S. Application Data

(63) Continuation of application No. 11/016,712, filed on Dec. 21, 2004, now Pat. No. 7,348,828.

(30) Foreign Application Priority Data

May 6, 2004    (KR)    ............... 10-2004-0031954

(51) Int. Cl.
*G05F 1/10* (2006.01)
(52) U.S. Cl. .................................. 327/536; 363/60
(58) Field of Classification Search ................ 327/536; 363/59–60
See application file for complete search history.

(56) References Cited

U.S. PATENT DOCUMENTS

| | | | |
|---|---|---|---|
| 4,794,278 A | 12/1988 | Vajdic | |
| 5,315,557 A | 5/1994 | Kim et al. | |
| 5,367,489 A | 11/1994 | Park et al. | |
| 5,410,510 A | 4/1995 | Smith et al. | |
| 5,426,333 A | 6/1995 | Maeda | |
| 5,499,183 A | 3/1996 | Kobatake | |
| 5,727,019 A * | 3/1998 | Tatsumi | ........... 375/222 |
| 5,952,872 A | 9/1999 | Hur | |
| 5,959,854 A | 9/1999 | Okada | |
| 5,999,009 A | 12/1999 | Mitsui | |
| 6,052,022 A | 4/2000 | Lee | |
| 6,064,251 A | 5/2000 | Park | |
| 6,249,445 B1 | 6/2001 | Sugasawa | |
| 6,333,873 B1 | 12/2001 | Kumanoya et al. | |
| 6,492,862 B2 | 12/2002 | Nakahara | |
| 6,724,242 B2 | 4/2004 | Kim et al. | |
| 6,774,708 B2 | 8/2004 | Matsui | |
| 6,801,078 B2 | 10/2004 | Allum | |
| 6,901,009 B2 | 5/2005 | Natori | |
| 2003/0227321 A1 | 12/2003 | Kim et al. | |

FOREIGN PATENT DOCUMENTS

JP    2000-505621    2/2000

* cited by examiner

*Primary Examiner*—Donovan Lincoln
*Assistant Examiner*—Thomas J Hiltunen
(74) *Attorney, Agent, or Firm*—McDermott Will & Emery LLP

(57) ABSTRACT

The present invention provides voltage supplier for supplying an internal voltage with optimized drivability required for internal operation. The voltage supplier of a semiconductor memory device includes: an internal voltage detection means for detecting a voltage level of an internal voltage; a clock oscillation means for outputting a charge pumping clock signal; an internal voltage control means for controlling the clock oscillation means to be performed selectively in accordance with a data access mode or a non-data access mode; and a charge pumping means for outputting the internal voltage required for internal operation by pumping charges in response to the charge pumping clock signal.

13 Claims, 6 Drawing Sheets

US 7,514,986 B2

VOLTAGE SUPPLIER OF SEMICONDUCTOR MEMORY DEVICE

RELATED APPLICATIONS

This application is a Continuation of U.S. application Ser. No. 11/016,712, filed Dec. 21, 2004, which is U.S. Pat. No. 7,348,828, claiming priority of Korean Application No. 10-2004-0031954, filed May 6, 2004, the entire contents of each of which are hereby incorporated by reference.

FIELD OF INVENTION

The present invention relates to a semiconductor device; and, more particularly, to a voltage supplier of the semiconductor memory device for supplying an internal voltage to drive the semiconductor device.

DESCRIPTION OF PRIOR ART

Typically, a semiconductor memory device generates and uses various internal voltages required for internal operation by receiving a power supply voltage VDD and a ground voltage VSS which are applied from an exterior.

The required voltage for internal operation of the semiconductor memory device is mainly classified into three kinds of voltage, i.e., a core voltage Vcore, a high voltage Vpp and a low voltage Vbb. The core voltage Vcore is applied to a memory core region and the high voltage Vpp is used for driving a word line or over-driving. Furthermore, the low voltage Vbb is applied as a bulk voltage of an NMOS transistor in the core region.

Herein, the core voltage Vcore can be applied after reducing the power supply voltage VDD to a predetermined level. On the contrary, as the high voltage Vpp should be higher than the power supply voltage VDD and the low voltage Vbb should be lower than the ground voltage VSS, a specific voltage supplier is essentially required for the semiconductor memory device in order to generate the desired high voltage Vpp and low voltage Vbb, respectively.

FIG. 1 is a block diagram setting forth a conventional voltage supplier for supplying high/low voltages for use in internal operation of the semiconductor memory device.

Referring to FIG. 1, in order to generate a low voltage Vbb, the conventional power supply circuit includes a low voltage detector 11, a first ring oscillator 21, a first controller 31, a low voltage pumping circuit 41 and a low voltage clamping circuit 51. Herein, the low voltage detector 11 detects a level of the low voltage Vbb with respect to a first reference voltage Vref1 in order to generate a desired low voltage Vbb. The first ring oscillator 21 generates oscillation waves osc1a and osc2a with predetermined periods, wherein the first ring oscillator 21 is enabled according to the detection result of the low voltage detector 11. The first controller 31 controls the low voltage pumping circuit 41 in response to the oscillation waves osc1a and osc2a of the first ring oscillator 21. The low voltage pumping circuit 41 pumps charges in response to control signals p1a, p2a, g1a and g2a outputted from the first controller 31 so as to supply the desired low voltage Vbb. The low voltage clamping circuit 51 prevents the low voltage Vbb of the low voltage pumping circuit 41 from extremely being increased or decreased.

In addition, in order to supply a high voltage Vpp, the conventional power supply circuit further includes a high voltage detector 12, a second and a third ring oscillators 22 and 23, a second controller 32, a first high voltage pumping circuit 42, a third controller 33, a second high voltage pumping circuit 43 and a high voltage clamping circuit 52. Herein, the high voltage detector 12 detects voltage levels of a first and a second high voltage Vpp_stb and Vpp_act with respect to a second reference voltage Vref2, in order to generate the first and the second high voltages Vpp_stb and Vpp_act desirably. The second ring oscillator 22 generates oscillation waves osc1b and osc2b with predetermined periods and the third ring oscillator 23 generates oscillation waves osc1c and osc2c, according to the detection result of the high voltage detector 12. The second controller 32 controls the first high voltage pumping circuit 42 in response to the oscillation waves osc1b and osc2b outputted from the second ring oscillator 22. The first high voltage pumping circuit 42 outputs the first high voltage Vpp_stb for use in a standby mode by pumping charges, in response to control signals p1b, p2b, g1b and g2b of the second controller 32. The third controller 33 controls the second high voltage pumping circuit 43 in response to the oscillation waves osc1c and osc2c outputted from the third ring oscillator 23. The second high voltage pumping circuit 43 outputs the second high voltage for use in an active mode by pumping charges in response to control signals p1c, p2c, g1c and g2c outputted from the third controller 33. The high voltage clamping circuit 52 prevents the first and the second high voltages Vpp_stb and Vpp_act outputted from the first and the second high voltage pumping circuits 42 and 43 from extremely being increased or decreased.

FIG. 2 is a circuit diagram setting forth the first ring oscillator 21 of the conventional power supply circuit for supplying low voltage Vbb to the semiconductor memory device, which is depicted in FIG. 1.

Referring to FIG. 2, the first ring oscillator 21 is provided with a NOR gate NOR1, a first inverter chain I8 to I13, a second inverter chain I5 to I7, a third inverter chain I2 to I4 and a plurality of capacitors C1 to C16.

Herein, a low voltage detection signal bbe outputted from the low voltage detector 11 is inverted through a first inverter I1 and then, is inputted into one end of the NOR gate NOR1. The first inverter chain incorporates six inverters therein, i.e., an eighth inverter I8 to a thirteenth inverter I13, which are connected in series to form a closed loop circuit with the NOR gate NOR1. Thus, the output signal of the NOR gate NOR1 is inverted on and on while passing through the first inverter chain I8 to I13 of the closed loop circuit, and is again inputted into the other end of the NOR gate NOR1.

Meanwhile, the output signal of the tenth inverter I10 is inputted into the second inverter chain I5 to I7 and then, is thrice inverted at the second inverter chain I5 to I7 so that the oscillation wave osc1a is outputted. Here, the second inverter chain incorporates therein three inverters therein, i.e., a fifth inverter I5 to a seventh inverter I7, which are connected in series. The output signal of the NOR gate NOR1 is also inputted into the third inverter chain I2 to I4 and then, is thrice inverted so that the oscillation wave osc2a is outputted, wherein the third inverter chain incorporates therein three inverters, i.e., a second inverter I2 to a fourth inverter I4, connected in series.

Between the eighth inverter I8 and the ninth inverter I9, between the ninth inverter I9 and the tenth inverter I10, between the eleventh inverter I11 and the twelfth inverter I12, and between the twelfth inverter I12 and the thirteenth inverter I13, there exist four capacitors, respectively, which is employed for adjusting a load of an output terminal of each inverter I8, I9, I11 and I12 in the first inverter chain I8 to I13.

Meanwhile, since the second and the third ring oscillators 22 and 23 have a similar structure to the first ring oscillator 21, further detail description for the second and the third ring oscillators 22 and 23 will be abbreviated herein.

Referring back to FIGS. 1 and 2, detail operational mechanism of the conventional voltage supplier will be set forth hereinafter.

As described above, the low voltage Vbb is a voltage having a lower level than an inputted ground voltage VSS, which is generally used for bulk voltage of NMOS transistors in a cell area. Meanwhile, the first and the second high voltages Vpp_stb, Vpp_act which have higher level than the power supply voltage VDD, are used for driving word lines or overdriving, in which the first high voltage Vpp_stb is used in a standby mode and the second high voltage Vpp_act is used in an active mode.

To begin with, the low voltage detector 11 detects a level of a currently outputted low voltage Vbb with respect to the first reference voltage Vref1, and transferring a detection result to the first ring oscillator 21. Herein, among signals inputted to the low voltage detector 11, a first input signal Tm_bi is to enable the low voltage detector 11 when a burn-in test is performed. Here, the burn-in test is typically carried out in the worst situation of high temperature and high voltage after fabrication of the semiconductor device. A second input signal Tm_vbbup and a third input signal Tm_vbbdn are used for increasing and decreasing the level of the low voltage Vbb, respectively. That is, the second and the third input signals Tm_vbbup and Tm_vbbdn play roles in increasing or decreasing the level of the low voltage Vbb for forcibly operating the first ring oscillator 21, the first controller 31 and the low voltage pumping circuit 41. If the low voltage detector 11 detects that the level of the inputted low voltage Vbb is different from the first reference voltage Vref1, the low voltage detection signal bbe is activated.

Afterwards, the first ring oscillator 21 outputs the oscillation waves osc1a and osc1b with the predetermined periods in response to the activated low voltage detection signal bbe. That is, provided that the output signal bbe of the low voltage detector 11 is activated to be in logic high level, the NOR gate NOR1 of the first ring oscillator 21 acts as an inverter and thus, the oscillation waves osc1a and osc1b are outputted through the first inverter chain I8 to I13 and the NOR gate NOR1. The plurality of capacitors C1 to C16 in the closed loop circuit adjusts frequency of each oscillation wave osc1a and osc1b to thereby adjust an output load of each inverter I8 to I13. That is, the frequency of the oscillation wave can be adjusted by the number of capacitors connected to the output terminal of each inverter I8 to I13.

Thereafter, the first controller 31 receives the oscillation waves osc1a and osc1b and outputs a plurality of control signals p1a, p2a, g1a and g2a in order to operate the low voltage pumping circuit 41. Thereafter, the low voltage pumping circuit 41 pumps charges to output the low voltage Vbb and transfers the outputted low voltage Vbb to the low voltage clamping circuit 51. Finally, the low voltage clamping circuit 51 prevents the low voltage from being extremely increased or decreased so as to output the desired low voltage.

Meanwhile, the conventional voltage supplier generates two kinds of high voltage Vpp_stb and Vpp_act. Since the operational mechanism is similar to that of the low voltage Vbb, detail descriptions will be omitted. The current required for the standby mode is largely different from the current required for the active mode so that two kinds of high voltage Vpp_stb and Vpp_act are needed in the memory device. For example, if the periods of the oscillation waves osc1b and osc2b outputted from the second ring oscillator 22 is increased and the periods of the oscillation waves osc1c and osc2c outputted from the third ring oscillator 23 is decreased, it is possible to supply the high voltage Vpp_stb and Vpp_act adaptive for the standby mode and the active mode, respectively.

However, as the semiconductor technology is advanced more and more, an internal voltage level to drive the semiconductor memory device is reduced on and on. Therefore, a drivability for maintaining the high voltage outputted from the voltage supplier has been a highlighted issue. That is, the low level of the internal voltage causes an error in the device due to drivability problem even though a circuit is normal. In other words, provided that the drivability of the high voltage applied to the internal circuit is low, the operational speed of the device is remarkably decreased. On the contrary, if the drivability is high, there is happened a noise so as to induce operational error in the device. As a result, in case that high voltage Vpp is applied to the internal circuit in a low-voltage memory device, it is difficult to generate the high voltage which is optimized for the internal operation of the memory device.

SUMMARY OF INVENTION

It is, therefore, an object of the present invention to provide a voltage supplier for supplying an internal voltage with optimized drivability.

In accordance with an aspect of the present invention, there is provided a voltage supplier of a semiconductor memory device including: an internal voltage detection means for detecting a voltage level of an internal voltage; a clock oscillation means for outputting a charge pumping clock signal; an internal voltage control means for controlling the clock oscillation means to be performed selectively in accordance with a data access mode or a non-data access mode; and a charge pumping means for outputting the internal voltage required for internal operation by pumping charges in response to the charge pumping clock signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a voltage supplier of a semiconductor memory device in accordance with the present invention will be described in detail referring to the accompanying drawings.

Figure 1:
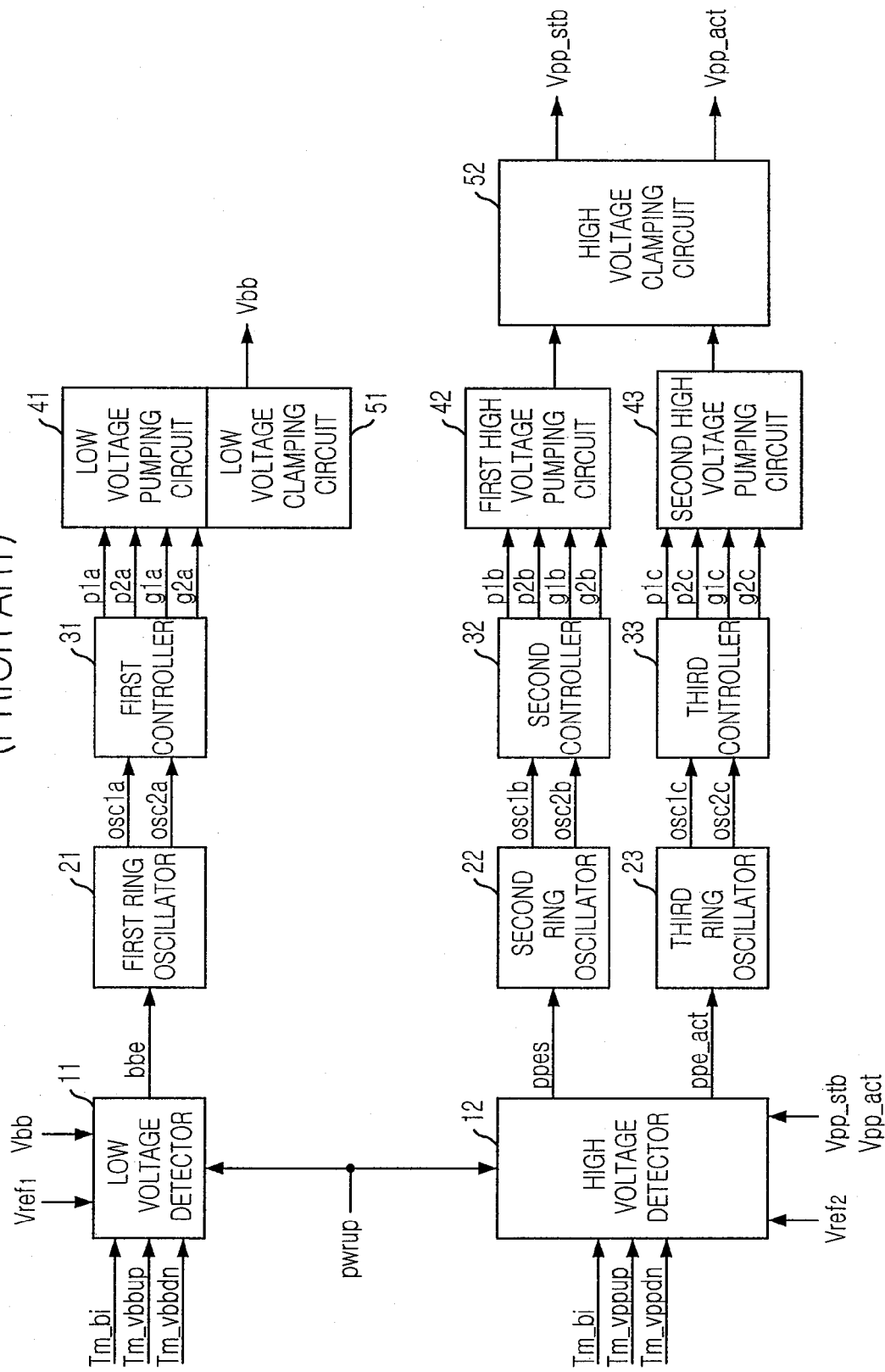
FIG. 1 is a block diagram setting forth a conventional voltage supplier for supplying high/low voltages for use in internal operation of the semiconductor memory device.
Figure 2:
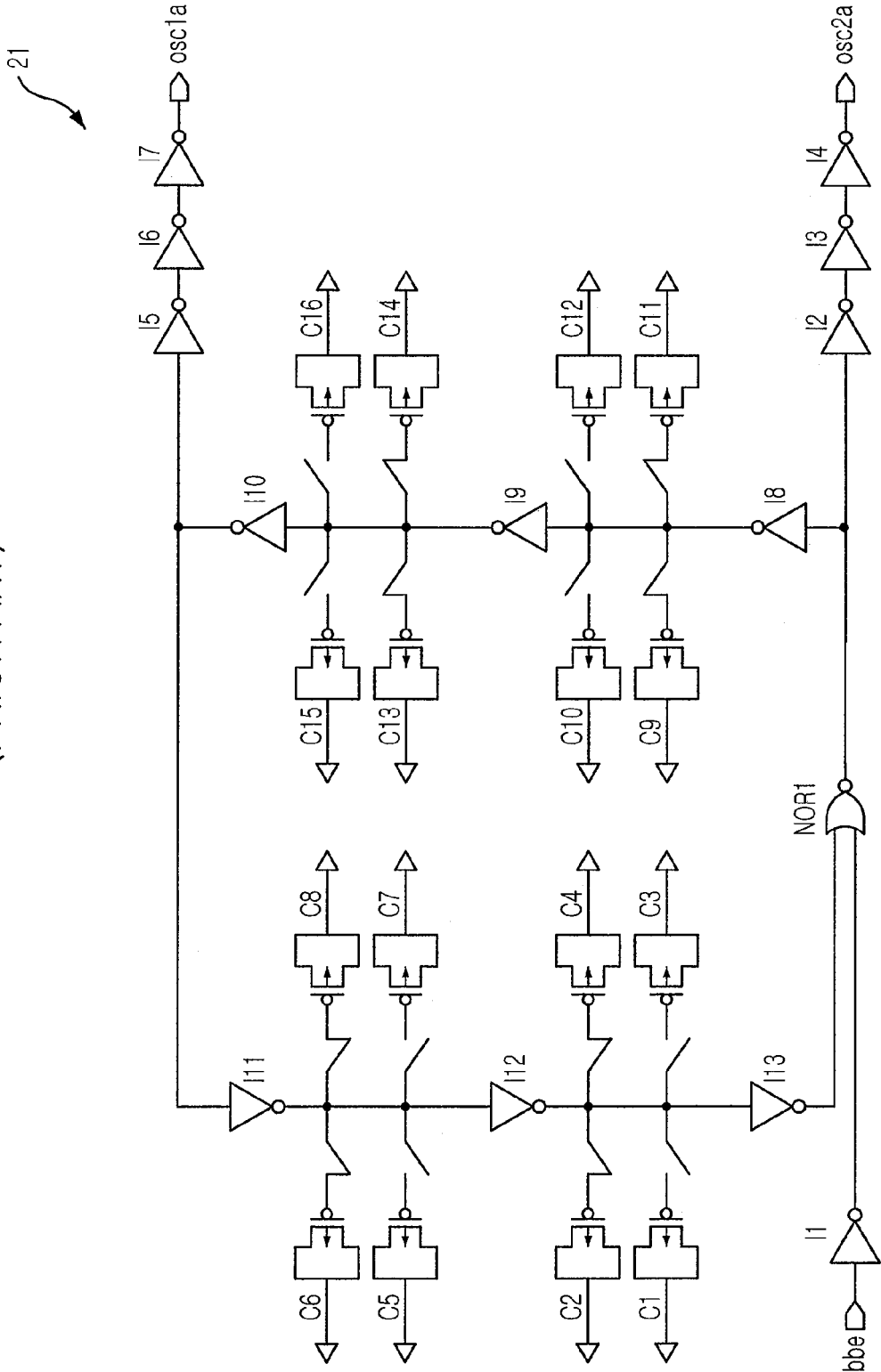
FIG. 2 is a circuit diagram explaining a first ring oscillator of the conventional power supplier for supplying low voltage to the semiconductor memory device, depicted in FIG. 1.
Figure 3:
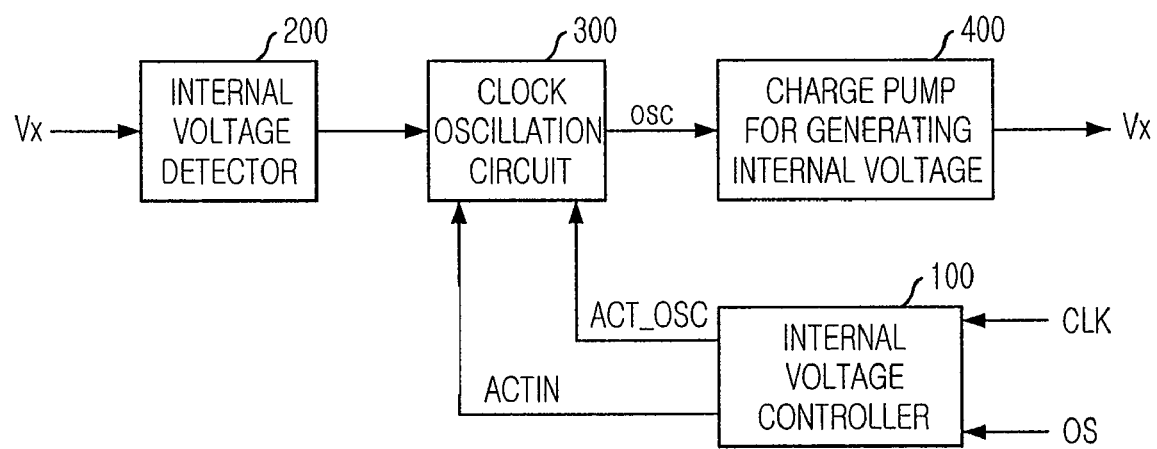
FIG. 3 is a block diagram setting forth a voltage supplier of a semiconductor memory device in accordance with a preferred embodiment of the present invention.

FIG. 3 is a block diagram setting forth a voltage supplier of a semiconductor memory device in accordance with a preferred embodiment of the present invention.

Referring to FIG. 3, the inventive voltage supplier includes an internal voltage detector 200, a clock oscillation circuit 300, an internal voltage controller 100 and a charge pumping unit 400. Herein, the internal voltage detector 200 detects a level of an internal voltage Vx. The clock oscillation circuit 300 outputs a charge pumping clock signal OSC by receiving a first clock signal IN_OSC or a second clock signal ACT_OSC, in response to the level of the internal voltage Vx detected at the internal voltage detector 200. The internal voltage controller 100 supplies the second clock signal ACT_OSC with a predetermined period corresponding to a current consumed for data access, into the clock oscillation circuit 300. In addition, the internal voltage controller 100 makes the clock oscillation circuit 300 stop operating while the second clock signal ACT_OSC is applied. The charge pumping unit 400 for generating internal voltage supplies charges in response to the charge pumping clock signal OSC. The clock oscillation circuit 300 does not perform an internal oscillation operation by means of a control signal ACTIN outputted from the internal voltage controller 100 and outputs the charge pumping clock signal OSC by receiving the second clock signal ACT_OSC.

Therefore, the semiconductor memory device of the present invention uses the second clock signal ACT_OSC as a charge pumping clock signal during a predetermined operational period corresponding to an active command, a read/write command or an auto refresh command. On the other hand, the clock oscillation circuit 300 outputs the first clock signal IN_OSC as the charge pumping clock signal during a self refresh operational period or a standby mode period, i.e., during a period that the data access is not performed.

That is, as there are required lots of charges during the period corresponding to the data access mode such as the active command, the read/write command or the auto refresh command, the second clock signal ACT_OSC is utilized as the charge pumping clock signal OSC with the predetermined period corresponding to current consumed for data access. In addition, since the self refresh mode or the standby mode dose not require lots of charges in comparison with the active mode, the first clock signal IN_OSC is used as the charge pumping clock signal OSC which is internally oscillated at the clock oscillation circuit 300. The charge pumping unit 400 outputs the charge pumping clock signal OSC as the internal voltage Vx.

Figure 4:
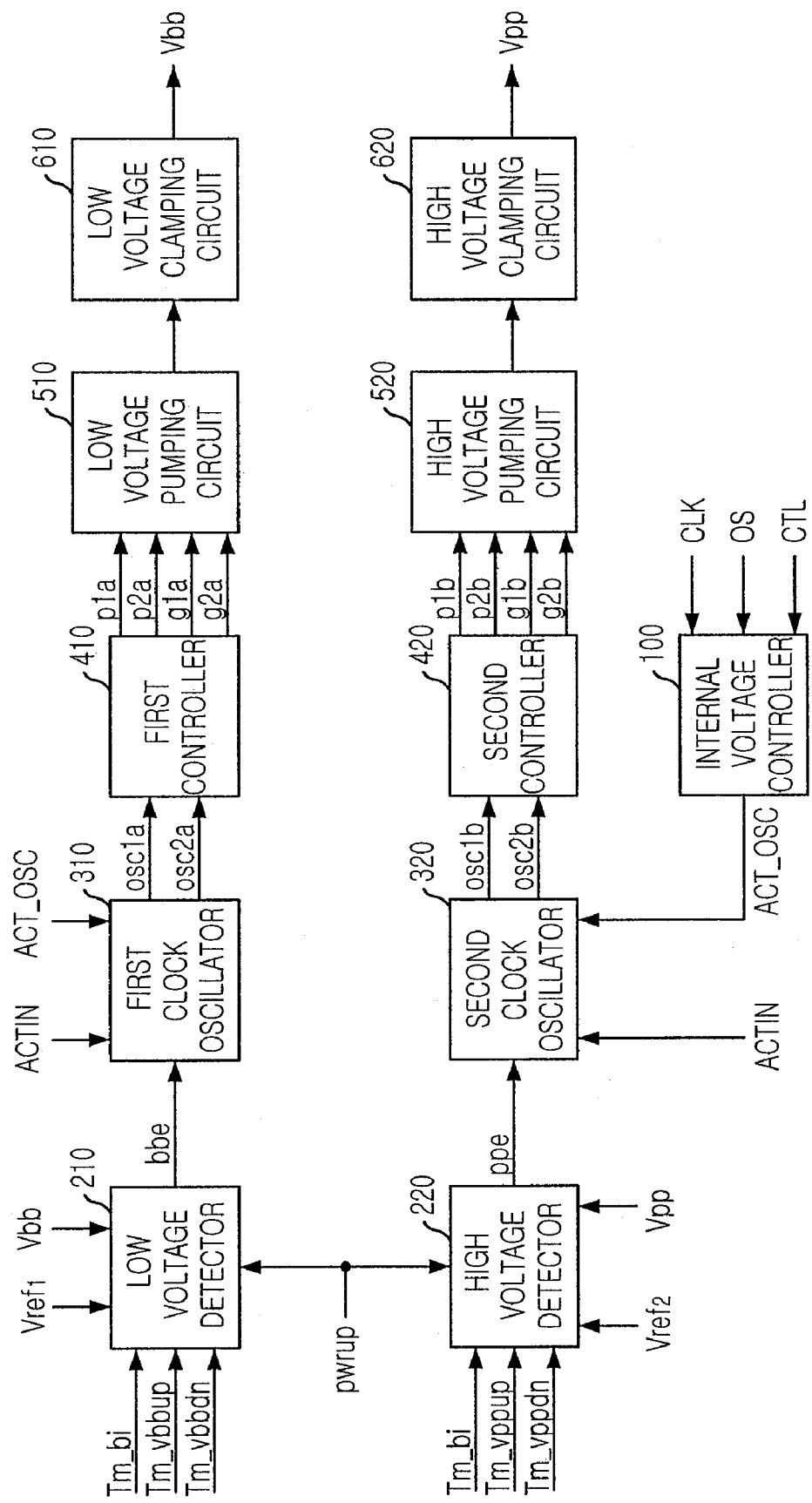
FIG. 4 is a block diagram setting forth a detail circuit structure of the voltage supplier in accordance with the preferred embodiment of the present invention.

FIG. 4 is a block diagram setting forth a detail circuit structure of the voltage supplier in accordance with the preferred embodiment of the present invention.

Referring to FIG. 4, in order to supply a low voltage Vbb, the inventive voltage supplier includes a low voltage detector 210, a first clock oscillator 310, a first controller 410, a low voltage pumping circuit 510 and a low voltage clamping circuit 610. Herein, the low voltage detector 210 detects a level of the low voltage Vbb with respect to a first reference voltage Vref1 in order to generate a desired low voltage Vbb. The first clock oscillator 310 outputs a first clock signal IN_OSC or a second clock signal ACT_OSC as a low voltage-charge pumping clock signal osc1a and osc2a, in response to the level of the low voltage Vbb detected at the low voltage detector 210. The first controller 410 controls the low voltage pumping circuit 510 in response to the low voltage-charge pumping clock signal osc1a and osc2a. The low voltage pumping circuit 510 pumps charges in response to control signals p1a, p2a, g1a and g2a outputted from the first controller 410 so as to supply the desired low voltage Vbb. The low voltage clamping circuit 610 prevents the low voltage Vbb of the low voltage pumping circuit 510 from extremely being increased or decreased.

In addition, in order to supply a high voltage Vpp, the inventive power supply circuit further includes a high voltage detector 220, a second clock oscillator 320, a second controller 420, a high voltage pumping circuit 520 and a high voltage clamping circuit 620. Herein, the high voltage detector 220 detects a voltage level of a high voltage Vpp with respect to a second reference voltage Vref2, in order to generate the first and the second high voltages Vpp_stb and Vpp_act desirably. The second clock oscillator 320 outputs the first clock signal IN_OSC and the second clock signal ACT_OSC as a high voltage-charge pumping clock signal osc1b and osc2b, in response to the voltage level of the high voltage Vpp detected at the high voltage detector 220. The second controller 420 controls the high voltage pumping circuit 520 in response to the high voltage-charge pumping clock signal osc1b and osc2b. The high voltage pumping circuit 520 pumps charges in response to control signals p1b, p2b, g1b and g2b outputted from the second controller 420 so as to supply the desired high voltage Vpp. Likewise, the high voltage clamping circuit 620 prevents the high voltage Vpp of the high voltage pumping circuit 520 from extremely being increased or decreased.

Unlike the conventional voltage supplier, when a control signal ACTIN is activated, the first and second clock oscillators 310 and 320 stops performing internal oscillating operation and outputs the low voltage-charge pumping clock signal osc1a and osc2a and the high voltage-charge pumping clock signal osc1b and osc2b, respectively.

Figure 5:
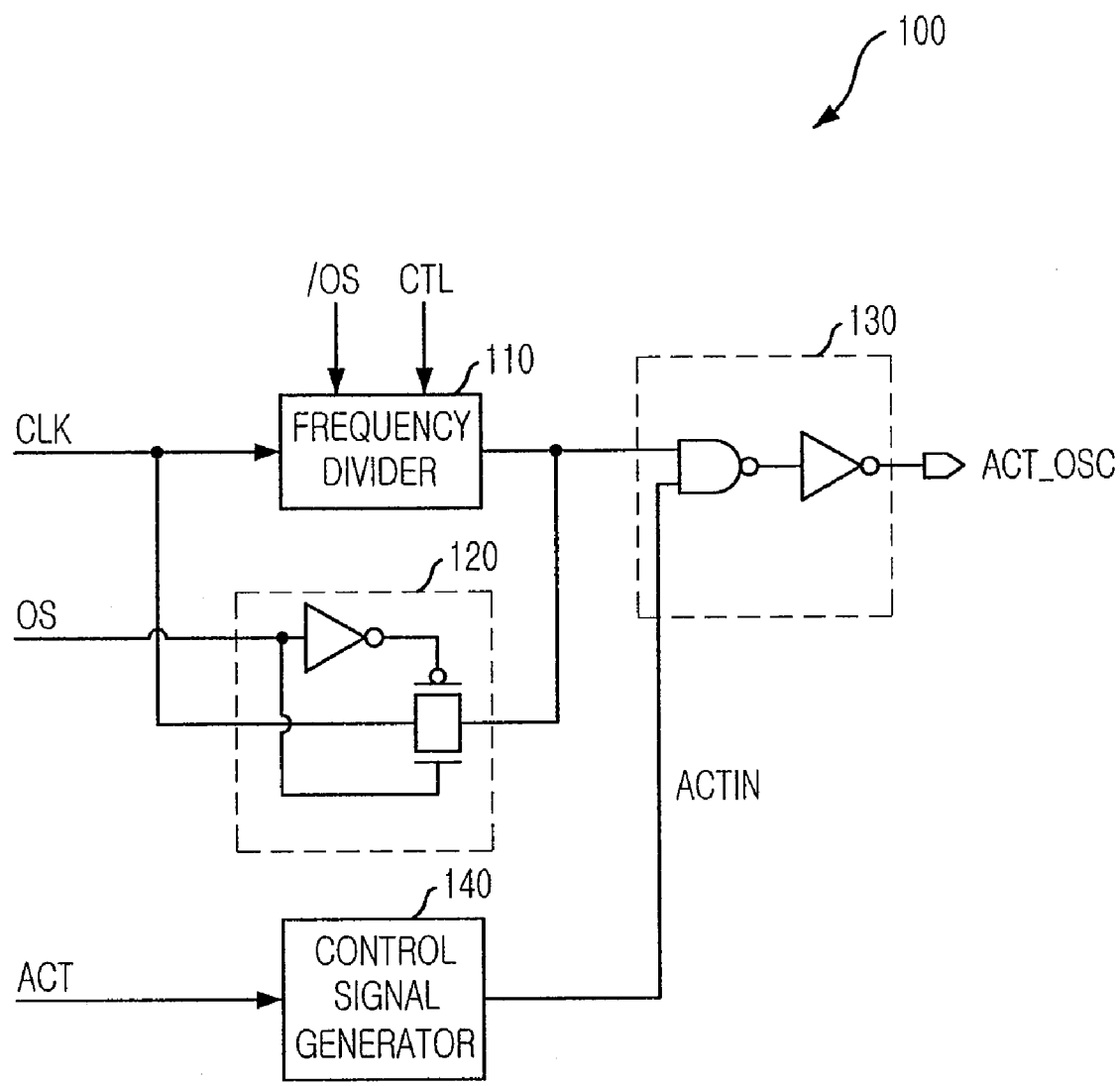
FIG. 5 is a circuit diagram setting forth the internal voltage controller depicted in FIG. 3 in accordance with the present invention.

FIG. 5 is a circuit diagram setting forth the internal voltage controller 100 depicted in FIG. 3 in accordance with the present invention.

Referring to FIG. 5, the internal voltage controller 100 of the present invention includes a frequency divider 110, a clock signal output unit 130 and a control signal generator 140. Herein, the frequency divider 110 receives an external clock CLK and divides the external clock CLK by a predetermined period corresponding to current consumed for data access. The control signal generator 140 generates the control signal ACTIN in response to an active command ACT. The clock signal output unit 130 outputs the external clock signal CLK divided by the frequency divider 110 as the second clock signal ACT_OSC, wherein the clock signal output unit 130 is enabled by the control signal ACTIN.

As aforementioned, the predetermined period to divide the external clock signal CLK is correspondent to current consumption for data access. Therefore, as current consumed for data access is increased, the predetermined period to divide the external clock CLK is also increased, and vice versa. Accordingly, the frequency divider 110 divides the external clock signal CLK by an appropriate period for the above circumstances after receiving an external control signal CTL.

Meanwhile, the internal voltage controller 100 further includes a transfer gate 120 for transferring the external clock signal CLK to the clock output unit 130. The transfer gate 120 and the frequency divider 110 are selectively activated. Namely, when the transfer gate 120 is activated by receiving an operation signal OS, the frequency divider 110 is deactivated by means of an operation bar signal /OS, and vice versa.

Figure 6:
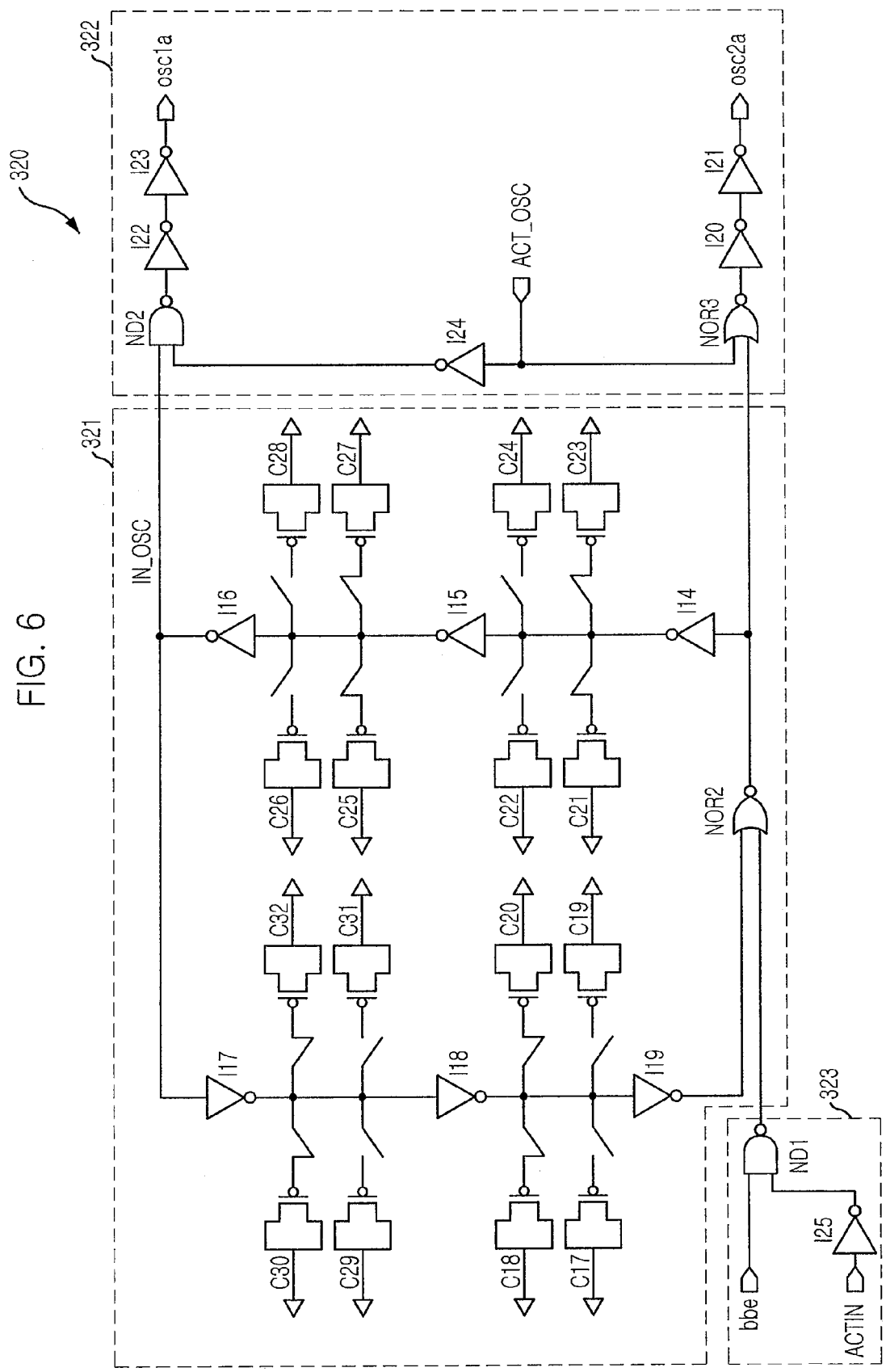
FIG. 6 is a circuit diagram setting forth the first clock oscillator in accordance with the present invention.

FIG. 6 is a circuit diagram setting forth the first clock oscillator 310 in accordance with the present invention.

Referring to FIG. 6, the first clock oscillator 310 includes a signal transferring unit 323, a clock oscillation unit 321 and a signal combination unit 322. Herein, the signal transferring unit 323 is activated by the control signal ACTIN and then, transfers the low voltage detection signal bbe which is outputted at the low voltage detector 210. The clock oscillation unit 321 oscillates and outputs the first clock signal IN_OSC in response to the low voltage detection signal bbe. The signal combination unit 322 outputs the first clock signal IN_OSC oscillated at the clock oscillator 323 as the low voltage-charge pumping clock signal osc1a and osc1b or transfers the second clock signal ACT_OSC as the low voltage-charge pumping clock signal osc1a and osc2a.

In detail, the clock oscillation unit 321 is provided with a NOR gate NOR2 and a first inverter chain I14 to I19, which forms a closed loop circuit. The output of a NAND gate NAND1 is inputted to one end of the NOR gate NOR2. The output of the NOR gate NOR2 is inverted several times and is inputted again into the other end of the NOR gate NOR2. Preferably, the clock oscillation unit 321 is configured with a ring oscillator.

The signal transferring unit 323 is provided with an inverter I25 and a NAND gate ND1, wherein the control signal ACTIN is inverted through the inverter I25 and the NAND gate ND1 performs a NAND operation to the inverted control signal ACTIN and the low voltage detection signal bbe.

The signal combination unit 322 is provided with a NOR gate NOR3, an inverter I24 for inverting the second clock signal ACT_OSC, a NAND gate ND2, a first buffer I22 and I23, and a second buffer I22 and I23. Herein, the NOR gate NOR3 receives the output of the NOR gate NOR2 and the second clock signal ACT_OSC and performs a NOR operation. The NAND gate ND2 receives the output of the inverter I24 and the output of the inverter I16 and performs a NAND operation. The first buffer I22 and I23 and the second buffer I22 and I23 outputs the low voltage-charge pumping signal osc1a and osc1b after buffering the output of the NAND gate ND2 and the output of the NOR gate NOR3, respectively.

Referring back to FIGS. 3 to 6, a mechanism of generating the high voltage Vpp is illustrated more in detail in accordance with the present invention hereinafter.

To begin with, the high voltage detector 220 outputs the high voltage detection signal ppe after detecting the voltage level with respect to the reference voltage Vref2. The second clock oscillator 320 performs oscillation operation in response to the high voltage detection signal ppe, when the first clock signal IN_OSC is oscillated at the clock oscillation unit 321. That is, the second clock oscillator 320 outputs the high voltage-charge pumping clock signal osc1b and osc2b by selecting one signal between the first clock signal IN_OSC and the second clock signal ACT_OSC, wherein the first clock signal IN_OSC is oscillated at the second clock oscillator 320 and the second clock signal ACT_OSC is outputted from the internal voltage controller 100. The second controller 420 outputs the plurality of pumping control signals p1b, p2b, g1b and g2b in response to the high voltage-charge pumping clock signal osc1b and osc2b. The high voltage pumping circuit 520 pumps charges in response to the plurality of the pumping control signals p1b, p2b, g1b and g2b.

Meanwhile, if the control signal ACTIN is activated, the second clock oscillator 320 stops the operation of the clock oscillation unit 321 and outputs the high voltage-charge pumping clock signal osc1b and osc2b after buffering the second clock signal ACT_OSC outputted from the internal voltage controller 100. On the other hand, if the control signal ACTIN is deactivated, the second clock oscillator 320 outputs the high voltage-charge pumping clock signal osc1b and osc2b after buffering the first clock signal IN_OSC oscillated at the clock oscillation unit 321.

Herein, the case that the control signal ACTIN is activated is the case of memory device performing an active operation or auto refresh, wherein the active operation is to perform an operation corresponding to an inputted active command or to perform a data access operation corresponding to an inputted read/write commands. In recent years, however, in order to reduce peak current of a high speed memory device, a piled refresh operation is performed to refresh each bank in different timing. At this time, the control signal ACTIN is activated also. Meanwhile, the case that the control signal ACTIN is deactivated is mainly a self refresh operation or the standby mode.

Therefore, in case of performing the active operation, the auto refresh operation or the piled refresh operation, there is much current consumption so that the second clock oscillator 320 uses the second clock signal ACT_OSC to output the high voltage. In addition, in case of the self refresh mode or the standby mode in which current consumption is relatively smaller than the above, the clock oscillator 320 uses the first clock signal IN_OSC to output the high voltage Vpp.

The mechanism for generating the low voltage Vbb is similar to the high voltage Vpp so that further detail description will be omitted herein.

As described above, the voltage supplier of the present invention supplies the high voltage Vpp_act for high current consumed operation and the high voltage Vpp_stb for low current consumed operation without any supplementary supplying circuit. Accordingly, it is possible to reduce circuit area of the voltage supplier in comparison with the prior art.

Furthermore, the inventive voltage supplier can supply the high voltage Vpp with optimized drivability with respect to operational frequency of the data access operation. As a result, the drivability of the high voltage Vpp is not increased abnormally so as to prevent unnecessary noise The present application contains subject matter related to the Korean patent application No. KR 2004-31954, filled in the Korean Patent Office on May 6, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A voltage supplier of a semiconductor memory device, comprising:
   a clock transferring block for receiving and transferring an external clock;
   a control signal generator for generating a control signal;
   a charge pumping unit for generating an internal voltage required for an internal operation by pumping charges in response to a clock signal; and
   a clock oscillation unit for generating the clock signal or outputting the external clock as the clock signal according to the control signal,
   wherein the clock transferring block includes:
   a frequency divider for dividing the external clock by a predetermined period;
   a clock transferring unit for transferring the external clock in responses to an operation signal; and
   a clock signal output unit for outputting one of the output signal of the frequency divider and the output signal of the clock transferring unit into the charge pumping unit in response to the control signal.

2. The voltage supplier of claim 1, wherein the control signal is activated in accordance with a data access mode or a non-data access mode.

3. The voltage supplier of claim 1, wherein the control signal is activated in accordance with one of an active command ACT, a read/write command and an auto refresh command.

4. The voltage supplier of claim 1, wherein the external clock has a period corresponding to an amount of current consumption required for a data access.

5. The voltage supplier of claim 1, further comprising an internal voltage detection means for detecting a voltage level of the internal voltage wherein the clock oscillation unit generates the clock signal according to according to the control signal and the detecting result.

6. The voltage supplier of claim 1, wherein the clock oscillation unit outputs the clock signal by receiving a first clock signal or a second clock signal, wherein the first clock signal is outputted as the clock signal in the non-data access mode and the second clock signal is outputted as the clock signal in the data access mode.

7. The voltage supplier of claim 6, wherein the data access mode is an operational period selected from a group consisting of an active command, a read/write command and an auto refresh command.

8. The voltage supplier of claim 6, wherein the non-data access mode is a period of a self refresh mode or a standby mode.

9. The voltage supplier of claim 1, wherein the predetermined period is corresponding to current consumed during the data access.

10. The voltage supplier of claim 1, wherein the clock oscillation unit includes:
   a control signal transferring unit for transferring a detection signal, which is activated in response to the control signal to generate an enable signal;
   a clock oscillation unit for generating the clock signal in response to the enable signal; and
   a signal combination unit for outputting the clock signal generated by the clock oscillation unit or outputting the external signal as the clock signal.

11. The voltage supplier of claim 10, wherein the clock oscillation unit is configured with a ring oscillator.

12. The voltage supplier of claim 11, wherein the clock oscillation unit further includes a plurality of capacitors for adjusting an output load of each inverter in the closed loop circuit.

13. The voltage supplier of claim 1, further comprising a voltage clamping means for preventing the internal voltage from extremely being increased or decreased.

* * * * *